United States Patent
Rieger et al.

(10) Patent No.: US 11,435,402 B2
(45) Date of Patent: Sep. 6, 2022

(54) METHOD OF MONITORING A MACHINE

(71) Applicant: Schneider Electric Industries SAS, Rueil-Malmaison (FR)

(72) Inventors: Michael Rieger, Lengfurt (DE); Juergen Heid, Altertheim (DE)

(73) Assignee: Schneider Electric Industries SAS, Rueil-Malmaison (FR)

( * ) Notice: Subject to any disclaimer, the term of this patent is extended or adjusted under 35 U.S.C. 154(b) by 232 days.

(21) Appl. No.: 16/903,641

(22) Filed: Jun. 17, 2020

(65) Prior Publication Data

US 2020/0393513 A1  Dec. 17, 2020

(30) Foreign Application Priority Data

Jun. 17, 2019 (EP) .................................... 19180500

(51) Int. Cl.
  *G01R 31/34* (2020.01)
  *G01M 15/00* (2006.01)
  *G05B 17/02* (2006.01)
  *G05B 19/4063* (2006.01)
  *G05B 19/4065* (2006.01)
  *G05B 23/02* (2006.01)

(52) U.S. Cl.
  CPC .......... *G01R 31/343* (2013.01); *G01M 15/00* (2013.01); *G05B 17/02* (2013.01); *G05B 19/4063* (2013.01); *G05B 19/4065* (2013.01); *G05B 23/0283* (2013.01); *G05B 2219/42155* (2013.01)

(58) Field of Classification Search
  CPC .......................... G05B 17/02; G05B 19/4063; G05B 19/4065; G05B 23/0283; G05B 19/048; H02P 6/08; H02P 23/14; H02P 6/34

USPC .................................................... 318/558, 34
See application file for complete search history.

(56) References Cited

U.S. PATENT DOCUMENTS 5,920,162 A * 7/1999 Hanson ..................... H02P 9/02
                                                                 322/29
7,116,073 B1 * 10/2006 Sorkin ..................... H02P 25/02
                                                                 318/431

FOREIGN PATENT DOCUMENTS

| CN | 103955165 A | 7/2014 |
|----|-------------|--------|
| CN | 104573255 A | 4/2015 |
| DE | 10 2011 121 839 A1 | 6/2013 |

(Continued)

OTHER PUBLICATIONS

Extended European Search Report dated Jan. 3, 2020 in European Patent Application No. 19180500.1 (with English translation of Category of Cited Documents), 10 pages.

*Primary Examiner* — David Luo
(74) *Attorney, Agent, or Firm* — Oblon, McClelland, Maier & Neustadt, L.L.P.

(57) ABSTRACT

A method of monitoring a machine is described. The machine includes a mechanical system moved by a motor, where the mechanical system has more than two components coupled to each other. The two or more components move differently when the mechanical system is driven by the motor. The method includes repeatedly determining one movement factor of one of the components, and repeatedly determining one dynamic factor of one of the components. The movement factors of the remaining components are then calculated via a model of the mechanical system, and separate parameters for the components of the mechanical system are determined from the movement factor, the dynamic factor, and the calculated movement factors.

19 Claims, 2 Drawing Sheets

(56) References Cited

FOREIGN PATENT DOCUMENTS

DE    10 2015 200 609 A1    7/2016
EP         3 258 331 A1    12/2017

* cited by examiner

METHOD OF MONITORING A MACHINE

The present invention relates to a method of monitoring a machine in which a mechanical system is moved by a motor, wherein the mechanical system comprises more than two components coupled to one another, wherein one of the components comprises the motor, and wherein at least two of the components move differently when the motor drives the mechanical system.

Components which are mechanically coupled to one another and which are driven by a motor are in particular used in industrial machines. The motor can, for example, drive a drive shaft, wherein the drive shaft then serves to drive various movable components of the machine. The mechanical structure produced in this respect can become very complex, whereby sharply fluctuating torque requirements can arise for the motor. This can, for example, be due to the fact that a crank is e.g. driven by means of the drive shaft and in turn drives a slide moving to and fro. Depending on the position and speed of the slide, different forces, frictions and torques can occur in this respect. Other components coupled to the drive shaft can simultaneously bring about other forces and torques on the motor.

In addition to the force and torque requirements which anyway fluctuate in operation, additional force or torque components which are variable in time can influence the motor due to wear or external influences.

In particular in mechanical systems comprising a plurality of mutually coupled components, the forces and torques generated by the mechanical system can therefore usually only be roughly determined with great effort and only theoretically.

It is the underlying object of the invention to provide a method which makes mechanical parameters, such as forces and torques of the mechanical system, easily determinable and thus enables, in a simple manner, a monitoring of an industrial machine for changes and an improvement of the running behavior of the machine.

This object is satisfied by a method in accordance with claim 1.

In accordance with the method in accordance with the invention, at least one movement factor, alternatively also only one movement factor, of one of the components of the mechanical system is determined repeatedly. In addition, at least one dynamic factor, alternatively also only one dynamic factor, of one of the components of the mechanical system is determined repeatedly. Subsequently, the movement factors of the remaining components of the mechanical system are calculated by means of a model of the mechanical system and in particular by means of the determined movement factor. Finally, separate mechanical parameters for the components, preferably for all of the components, of the mechanical system are determined from the determined movement factor, from the determined dynamic factor and from the calculated movement factors.

In other words, in accordance with the invention, a measurement or observation is carried out at one of the components of the mechanical system, whereas the mechanical system performs a movement to determine a movement factor and a dynamic factor of the component. Since it is now known how the one component moves, the manner in which the remaining components of the mechanical system move can be calculated by means of the model of the mechanical system. This means that the movement factors of the remaining components of the mechanical system can be calculated. Once a dynamic factor of the component of the mechanical system is additionally known, e.g. by measuring the torque which the component introduces into the mechanical system, a dynamic parameter, i.e. a mechanical parameter (e.g. likewise a torque or a friction), can also be determined for a further component of the mechanical system. Due to the repeated determination of the dynamic factor, a plurality of measurement values detected after one another in time can in particular be available from which mechanical parameters can then be determined for a plurality of or even all of the components of the mechanical system. The determination of the mechanical parameters can in particular take place in a control unit of the machine or of an external control unit.

A mechanical parameter is in particular to be understood as a torque, as a force and/or as a parameter for calculating a torque or a force e.g. on the basis of an acceleration or of a speed, as will still be explained in more detail later. A movement factor, in contrast, e.g. indicates a speed, an acceleration or a position of a component of the mechanical system, as will likewise be presented in more detail later.

The dynamic factor can correspond to one of the mechanical parameters; however, in contrast to the mechanical parameter, it can be measured or determined.

The movement factor and the dynamic factor are in particular determined repeatedly for the same component of the mechanical system. The movement factor and the dynamic factor are preferably determined at the same point in time in each case.

A component of the mechanical system can in principle be understood as any desired constructions or sections of the mechanical system, e.g. sections of a drive train. One component can be the motor with a drive shaft, for example. A further component can be a gear fastened to the drive shaft, an eccentric disk and the like. Furthermore, a conveyor belt driven via the gear, a mass moved by means of the eccentric disk and the like can e.g. be a component of the mechanical system. In general, a component can e.g. be considered as a part of the machine for which at least one or more mechanical parameters are determined.

The determination of a factor is in particular understood such that the factor is measured and/or is calculated from a measured value. For example, the dynamic factor can be the torque delivered by the motor to the remaining mechanical system. This torque can either be measured directly or can be calculated based on a current (which is measured) consumed by the motor and/or on a measured power consumed by the motor.

The motor is in this respect to be understood as a component or as part of a component of the mechanical system. The motor is the component that drives the mechanical system. For this purpose, the motor can in particular carry out a rotation of a motor shaft. The remaining components of the mechanical system can, for example, perform linear and/or rotary movements. In this respect, any desired forms of the movement are conceivable, for example, mixtures of linear movements and rotary movements, eccentric movements and the like. In other words, the motor performs an input movement which sets the remaining components into an output movement in each case. The movement of the components is described by the movement factors and can be calculated from the rotary movement of the motor and/or from the movement of the components based on the transfer function which will be explained in more detail later.

The determined mechanical parameters in accordance with the invention are preferably each associated with exactly one component. The mechanical parameters can be determined for different times or different positions of the respective component.

The mechanical system in particular comprises exactly one motor.

A different movement is e.g. to be understood such that two components do not move in a parallel and uniform manner, but e.g. perform opposite movements, move at different speeds and/or accelerations at a point in time, move in different directions and the like. Different movements can also be linear movements in comparison with rotary movements.

Advantageous further developments of the invention can be seen from the description, from the drawings and from the dependent claims.

In accordance with a first advantageous embodiment, a plurality of values of the determined movement factor and/or of the determined dynamic factor are used to determine the mechanical parameters for the components of the mechanical system. The plurality of determined values can comprise values for different times and movement states of the machine. The determined values can differ from one another at different times and in different states since the components of the machine can, for example, move forward and backward, a movement-dependent friction can be present, influences and/or reactions by products processed by the machine (e.g. different masses of the products) can be present, etc.

In accordance with a further advantageous embodiment, an equation system having a plurality of equations, preferably having one equation per value of the determined movement factor, is set up and solved to determine the mechanical parameters. The equation system can in particular be set up in the form of a matrix equation. There can in particular be exactly one respective unknown per equation for each mechanical parameter to be determined.

In accordance with a further advantageous embodiment, the movement factor comprises a speed; a position; an acceleration; an angular speed; an angular position; and/or an angular acceleration. The movement factor can therefore comprise quantities/factors which describe a translatory movement or a rotary movement of a component. Generally speaking, the movement factor together with any further movement factors describes a movement of one of the components. The movement factor can in particular be detected from outside the component, e.g. visually and/or without contacting the component.

In accordance with a further advantageous embodiment, the model of the mechanical system comprises at least one transfer function which describes the movement of a first component in dependence on the movement of a second component which is coupled to the first component. Due to the transfer function, it is, for example, possible with the model to draw conclusions on the movement of a component directly coupled to the motor from the known (measured) rotation of the drive axis of the motor and to calculate the movement of the component coupled to the motor. The motor can, for example, move a slide back and forth via a crank rod. For this purpose, the model can comprise a corresponding transfer function so that the instantaneous position, speed and acceleration of the slide can be calculated from the angular position, from the angular speed and from the angular acceleration of the motor (or of the motor shaft). The motor can in particular be used as a sensor, preferably as the only sensor, by measuring the current consumed by the motor and the rotational position of the motor. A servo device, i.e. the motor with its control and, optionally, with a rotary encoder, can also be used as a sensor or as the only sensor.

Moreover, the model can also comprise further transfer functions which indicate the movement of further components. A chain of transfer functions for describing the movement of all the components of the mechanical system can in particular be covered by the model. For example, a spring can be fastened to the aforesaid slide and in turn moves an arm. The movement of the arm can then be calculated by a further transfer function based on the movement of the slide.

Furthermore, the model can comprise boundary conditions for the movements of the components, for example, mechanical limitations.

In accordance with a further advantageous embodiment, the movement factors are each multiplied by a derivative of the transfer function which describes the movement of the respective component. The derivative is in particular defined by a fraction which, in the numerator, comprises the change of the movement of the respective described component, whereas, in the denominator, it comprises the change of the component driving the described component ($dx_{out}/dx_{in}$). It is advantageously made possible by the derivative to also detect variable processes in the machine. The derivative in particular also communicates the conversion of the output torque to the input torque, or of the output force to the input force, or of the output force to the input torque or of the output torque to the input force of one of the components.

In accordance with a further advantageous embodiment, the mechanical parameters comprise a torque and/or a force, in particular a constant torque, a moment of inertia, a viscous friction, a static friction and/or a constant force. The constant torque can, for example, be caused by friction. Alternatively or additionally, the mechanical parameters comprise a constant for the calculation of a torque or of a force e.g. on the basis of an acceleration or of a speed.

The mechanical parameters are in particular to be understood as values which describe components of the mechanical system and which in particular describe dynamic processes, i.e. values which are dependent on the instantaneous speed, the instantaneous position and/or the instantaneous acceleration of one of the components.

The mechanical parameters can in particular comprise:
- a parameter for a speed-dependent force ($k_{Fvel}$), preferably with the unit [N/(1/s)];
- a parameter for a static force ($k_{Fstat}$), preferably with the unit [N];
- a parameter for a constant force ($k_{Fconst}$), preferably with the unit [N];
- a mass m (unit [kg]);
- a moment of inertia J (unit [kg*m$^2$]);
- a parameter for a torque ($k_{Mvel}$) dependent on the rotational speed, preferably with the unit [Nm/(rad/s)];
- a parameter for a static torque ($k_{Mstat}$), preferably with the unit [Nm]; and/or
- a parameter for a constant torque ($k_{Mconst}$), preferably with the unit [Nm].

The static force and/or the static torque, which are described by the parameters $k_{Fstat}$ and $k_{Mstat}$ respectively, preferably only have an effect at a speed or angular speed unequal to zero and in particular counteract the direction of movement. The constant force and/or the constant torque, which are described by the parameters $k_{Fconst}$ and $k_{Mconst}$ respectively, preferably always have an effect.

In accordance with a further advantageous embodiment, the method described herein is carried out separately several times, in particular twice, to determine mechanical parameters for different directions of movement of one (the same) component. A separate execution of the method can also be performed for each direction of movement of each component. For example, the method can be carried out once while a component moves in a first direction. The method can be carried out a second time if the component then moves in a second direction which is opposite to the first direction. The movement can be both translatory and rotary in this respect.

In particular the above-mentioned parameters for describing the static force and/or the static torque can be determined by the multiple execution of the method. Without the multiple execution, in particular only the parameters for a constant force and for a constant torque can be determined.

To determine the parameters $k_{Fstat}$ and $k_{Mstat}$, the respective parameter $k_{Fconst}$ is determined in the respective execution of the method. Due to the fact that the static force and the static torque each counteract the movement and that the constant force and the constant torque always act in the same direction, the equations $$k_{Mconst\_direction\ 1} = k_{Mconst} + k_{Mstat}$$

$$k_{Mconst\_direction\ 2} = k_{Mconst} - k_{Mstat}$$

result for rotary movements. For translatory movements, in contrast, the following results:

$$k_{Fconst\_direction\ 1} = k_{Fconst} + k_{Fstat}$$

$$k_{Fconst\_direction\ 2} = k_{Fconst} - k_{Fstat}.$$

These equations can be broken down to $$k_{Mconst} = (k_{Mconst\_direction\ 1} + k_{Mconst\_direction\ 2})/2$$

$$k_{Mstat} = (k_{Mconst\_direction\ 1} - k_{Mconst\_direction\ 2})/2$$

and $$k_{Fconst} = k_{Fconst\_direction\ 1} + k_{Fconst\_direction\ 2})/2$$

$$k_{Fstat} = (k_{Fconst\_direction\ 1} - k_{Fconst\_direction\ 2})/2.$$

In this way, direction-dependent forces and torques can therefore be determined which only occur during movement.

When setting up the equation system, a term is preferably inserted into each equation of the equation system for each mechanical parameter, which term multiplies the mechanical parameter by a measured, calculated or otherwise determined quantity/factor (i.e. a movement factor) and/or by the derivative of the respective transfer function. The term is in this respect in particular selected such that a respective torque is calculated in each term. Subsequently, all the terms can be added, whereby a total torque in particular results which corresponds to the torque to be applied by the motor and to be delivered to the mechanical system.

It must be mentioned in this connection that the motor preferably provides the total torque, which is required to move all the components, at any point in time. Thus, due to the conservation of energy, it is possible to draw conclusions on the mechanical parameters of the remaining components from the torque delivered by the motor and from the measurement of the rotary movement of said motor. Due to the conservation of energy, the energy introduced by the motor by means of a rotary movement is equal to the energy required by the remaining components in their translatory and/or rotary movements. Due to the conservation of energy, it is possible by means of the above-explained derivative to convert between an output force (in the case of translatory movements) and an input torque (in the case of rotatory movements) necessary therefor (or vice versa). With a rotary input and a rotary output, the derivative communicates between the output torque and the input torque necessary therefor. The derivative acts as a position-dependent "transmission factor".

If the mechanical system now, by way of example, comprises three components (K1, K2 and K3), wherein the motor itself carries out a rotary movement (with the function $\varphi_{K1}$) e.g. of a crank and in so doing drives a second component which moves in a translatory manner and a third component which performs a rotary movement, the torque M delivered by the motor can be equated with nine terms in a respective equation of the equation system:

$$M = (\alpha_{K1} * J_{K1} + \omega_{K1} * k_{Mvel,K1} + k_{Mstat,K1}) +$$
$$\left(acc_{K2} * \frac{dx_{K2}}{d\varphi_{K1}} * m_{K2} + vel_{K2} * \frac{dx_{K2}}{d\varphi_{K1}} * k_{Fvel,K2} + \frac{dx_{K2}}{d\varphi_{K1}} * k_{Fstat,K2}\right) +$$
$$\left(\alpha_{K3} * \frac{dx_{K3}}{d\varphi_{K1}} * J_{K3} * \omega_{K3} * \frac{dx_{K3}}{d\varphi_{K1}} * k_{Mvel,K3} + \frac{dx_{K3}}{d\varphi_{K1}} * k_{Mstat,K3}\right)$$

The movements of the second and third components are described by transfer functions, which are named $x_{K2}$ and $\varphi_{K3}$ in the above example. In this respect, "x" indicates a translatory movement and "p" indicates a rotary movement. Since both the second component and the third component are driven by the first component (i.e. the motor), the derivative in this example always takes place in accordance with the function $\varphi_{K1}$. The derivative of the transfer function for the first component is not explicitly shown. Since the first component drives "itself", the transfer function here is a proportionality whose derivative is "1".

In this respect, the values for M, $\alpha$, $\omega$, acc and vel are known by way of measurement or calculation and are entered into an equation for the same point in time. Due to the multiple measurement or calculation of the values, respective new equations can be set up for different points in time, whereby an equation system results which includes at least the same number of or more equations than unknowns.

In general, the equation system for n components can be written as a matrix equation system which then has the following form:

$$[BG_{K1}|BG_{K2}|BG_{K3}| \ldots |BG_{Kn}]*(MP)=(M).$$

$BG_{Ki}$ is a matrix of the movement factors in this respect. MP is a vector with the mechanical parameters to be determined. M is a vector with torques. These torques preferably correspond to the respective torque delivered by the motor at a point in time.

For an unambiguous solution of the matrix equation system, a multiplication by the transpose of the matrix of all the movement factors can be performed at both sides of the equation system. In this respect, a new equivalent matrix equation system results, but with a square matrix, which now enables an unambiguous solution of the equation system since the number of rows and columns of the matrix is equal to the number of mechanical parameters sought. The mechanical parameters sought can then be calculated, wherein the determined mechanical parameters in particular lie on a hyperplane in a space with the dimension "number of mechanical parameters sought". The mechanical parameters sought and thus the hyperplane can preferably be determined such that the sum of squared deviations is minimized ("least-square-fit").

The following conversion can therefore be performed:

$$A*(MP)=(M)$$

becomes $$(A^T*A)*(MP)=A^T*(M).$$

Here, A is a matrix with all the matrices $BG_{Ki}$ and $A^T$ is the transpose of the matrix A.

In the following, the above example will be further explained again in which the motor drives a second component moving in a translatory manner and a third component performing a rotary movement. In the case of measurements at different points in time (t1, t2, t3, . . . , tn), new equations can respectively be set up, wherein the equation system created in this manner is represented as a matrix equation system below.

$$\begin{pmatrix} \alpha_{K1,t1} & \omega_{K1,t1} & 1 & acc_{K2,t1}* & vel_{k2,t1}*\frac{dx_{K2,t1}}{d\varphi_{K1,t1}} & \frac{dx_{K2,t1}}{d\varphi_{K1,t1}} & \alpha_{K3,t1}*\frac{d\varphi_{K3,t1}}{d\varphi_{K1,t1}} & \omega_{K3,t1}*\frac{d\varphi_{K3,t1}}{d\varphi_{K1,t1}} & \frac{d\varphi_{K3,t1}}{d\varphi_{K1,t1}} \\ & & & & \frac{dx_{K2,t1}}{d\varphi_{K1,t1}} & & & & \\ \alpha_{K1,t2} & \omega_{K1,t2} & 1 & acc_{K2,t2}* & vel_{k2,t2}*\frac{dx_{K2,t2}}{d\varphi_{K1,t2}} & \frac{dx_{K2,t2}}{d\varphi_{K1,t2}} & \alpha_{K3,t2}*\frac{d\varphi_{K3,t2}}{d\varphi_{K1,t2}} & \omega_{K3,t2}*\frac{d\varphi_{K3,t2}}{d\varphi_{K1,t2}} & \frac{d\varphi_{K3,t2}}{d\varphi_{K1,t2}} \\ & & & & \frac{dx_{K2,t2}}{d\varphi_{K1,t2}} & & & & \\ \ldots & \ldots & \ldots & \ldots & \ldots & \ldots & \ldots & \ldots & \ldots \\ \alpha_{K1,tn} & \omega_{K1,tn} & 1 & acc_{K2,tn}* & vel_{k2,tn}*\frac{dx_{K2,tn}}{d\varphi_{K1,tn}} & \frac{dx_{K2,tn}}{d\varphi_{K1,tn}} & \alpha_{K3,tn}*\frac{d\varphi_{K3,tn}}{d\varphi_{K1,tn}} & \omega_{K3,tn}*\frac{d\varphi_{K3,tn}}{d\varphi_{K1,tn}} & \frac{d\varphi_{K3,tn}}{d\varphi_{K1,tn}} \\ & & & & \frac{dx_{K2,tn}}{d\varphi_{K1,tn}} & & & & \end{pmatrix} * \begin{pmatrix} J_{K1} \\ k_{Mvel,K1} \\ k_{Mstat,K1} \\ m_{K2} \\ k_{Fvel,K2} \\ k_{Fstat,K2} \\ J_{K3} \\ k_{Mvel,K3} \\ k_{Mstat,K3} \end{pmatrix} = \begin{pmatrix} M_{t1} \\ M_{t2} \\ \ldots \\ M_{tm} \end{pmatrix}$$

For each row, an equation for a respective point in time results from the matrix equation system.

For example, for the second component, the speed acc (in [ms]) is multiplied by the parameter $k_{Fvel}$ (in [N/(1/s)]) and by the derivative of the transfer function $$\left(\frac{dx_{K2}}{d\varphi_{K1}},\right.$$

unit[in]) to obtain a torque ([kg*m²/s²] or[Nm]) in the term.

Three terms can in particular be inserted into the equations of the equation system for a component of mechanical system. Here, a distinction can preferably be made between a translatory movement and a rotary movement. In the case of a translatory movement, the first term can be the multiplication of the acceleration acc by the derivative of the transfer function (e.g. dx/dφ) of the component and a further multiplication by the mass m of the component. The second term can be the multiplication of the speed vel of the component by the derivative of the transfer function and by the parameter $k_{Fvel}$, i.e. vel*$k_{Fvel}$. The third term can only comprise the multiplication of the derivative of the transfer function by $k_{Fstat}$ or $k_{Fconst}$.

For a rotary movement, the first term can be the multiplication of the angular acceleration α of the component by the derivative of the transfer function and by the moment of inertia J of the component. The second term can be the multiplication of the angular speed ω of the component by the derivative of the transfer function and by the parameter $k_{Mvel}$. The third term can only comprise the multiplication of the derivative of the transfer function by $k_{Mstat}$ or $k_{Mconst}$.

The terms to be added to an equation for a component can thus be predetermined and can in particular be determined by whether the component performs a translatory movement or a rotary movement. Accordingly, it can be determined from the model, in particular automatically and/or generically, for example by the control unit of the machine, whether the component performs a translatory movement or a rotary movement. The corresponding terms can then be added, in particular automatically, to the equations of the equation system.

In accordance with a further advantageous embodiment, the determined movement factor and/or the determined dynamic factor is/are measured and/or calculated from a measured value. The determined movement factor and/or the determined dynamic factor can in particular be calculated from a motor torque. For example, the torque delivered by the motor to the mechanical system is calculated by a multiplication of the current consumed by the motor by a torque constant of the motor and, optionally, by a further multiplication by a transmission factor. The torque of the motor which is delivered or transmitted to the mechanical system can be the determined dynamic factor. In contrast, the determined movement factor can, for example, be the angular position of the motor or of the motor shaft and can be measured directly. By determining the first and second derivatives of the angular position, the angular speed and/or the angular acceleration of the motor can then be calculated. Alternatively, the angular position can also be derived indirectly or can be calculated.

In accordance with a further advantageous embodiment, the movement of the mechanical system is repeated after a machine cycle, wherein the determination of the movement factor and/or of the dynamic factor preferably takes place distributed over the total machine cycle, for example at time intervals of less than 1 second, preferably of less than 0.1 seconds, particularly preferably of less than 0.001 seconds.

The machine cycle is therefore defined as the movement which is run through until the movement of the mechanical system is repeated. This can, for example, be the case if a conveyor belt has completed a complete revolution or a sequence of recurring punching processes has been completed once. The motor can carry out a large number of revolutions within a machine cycle. In addition, different speeds, accelerations, etc. of the components can be observed within the machine cycle. The mechanical parameters can be determined due to the different boundary conditions within the machine cycle that are thus present.

In accordance with a further advantageous embodiment, a new determination of the mechanical parameters takes place when the determined movement factor and/or the determined dynamic factor changes/change, for example by more than 10% or by more than 15%. The mechanical parameters can, for example, be determined once and the determined values of the parameters can then be used in the further operation of the machine. A new determination of the mechanical parameters can take place to adapt the mechanical parameters to creeping changes, e.g. caused by gradual wear of the machine, and thus to keep them up to date. Alternatively or additionally, a new determination can also take place when intentional changes are made to the machine, for example by a product change, by the exchange or replacement of a component, by maintenance work and the like.

In accordance with a further advantageous embodiment, the model of the mechanical system comprises a digital twin. The digital twin can, for example, be generated with the aid of software such as IndustrialPhysics, e.g. on the basis of the CAD design of the machine. The digital twin thus represents a simulation model of the machine by which the movements of the components of the mechanical system can be simulated. The digital twin can be repeatedly adapted by the mechanical parameters determined at the real machine, whereby the digital twin can be readjusted to the real conditions in the machine. The simulation model can be generated from a machine project so that the creation of the simulation model is associated with little effort. The machine project can be a project from planning software (e.g. CAD software) for the machine. The function and the arrangement of the components can each be defined and represented in the planning software.

In accordance with a further advantageous embodiment, a value for at least one mechanical parameter is determined several times. In this respect, at least one mechanical parameter is first defined as a start value, wherein the start value is used for a feedforward control of the machine. The mechanical parameter is then (with an ongoing feedforward control) determined again (and preferably used as a new start value for the feedforward control or pilot control of the machine), wherein a noise in the measured values is reduced by the feedforward control, whereby the mechanical parameters can then in turn be determined more accurately. This process can be carried out repeatedly.

In accordance with a further advantageous embodiment, a change of the control of the motor takes place on the basis of at least one of the mechanical parameters. Since the region of the machine cycle in which an increased friction occurs can, for example, be known on the basis of the determined mechanical parameters, the increased friction to be expected can thus e.g. be compensated in an anticipatory manner by a targeted intervention in the control of the motor. In general, a feedforward control of the motor and in particular of the motor torque can therefore take place. An improved synchronization, an increased smooth running and positioning accuracy can hereby be achieved. Due to the smoother running of the mechanical system, wear phenomena of the mechanical system, among other things, can be reduced or the quality of the processed product or of the product to be manufactured can also be improved.

It is equally possible to e.g. carry out a predictive maintenance on the basis of at least one mechanical parameter. This can, for example, be indicated when the value of the mechanical parameter suddenly increases and/or decreases sharply or changes unusually in some other way. For example, a rise or fall of more than 20% within a predetermined time interval (e.g. 1 hour or 1 day) can thus be used as a criterion to trigger a predictive maintenance.

Such a predictive maintenance is in particular possible because individual mechanical parameters are determined for all the components and the component at which e.g. an increased friction currently occurs due to a worn bearing can thus be detected and localized. As further examples, the impact of a component on an obstacle can e.g. be recognized from the increase of $k_{Mconst}$ or $k_{Fconst}$ or a decreasing lubrication can be recognized from the increase of $k_{Mvel}$ or $k_{Fvel}$.

Finally, it is also possible to output at least one or more of the mechanical parameters and in particular to perform a statistical evaluation of the mechanical parameters. Weak points of the mechanical system can, for example, hereby be detected. It is also possible to draw conclusions on similar machines or machines of identical construction and to subject the similar machines or machines of identical construction to a necessary maintenance or modification.

A further subject of the invention is an industrial machine having a mechanical system. The mechanical system comprises a motor and at least two further components, wherein the components are coupled to one another, wherein at least the two components move differently when the motor drives the mechanical system, and wherein the machine comprises at least one sensor and a processing device and is designed to repeatedly determine at least one movement factor of one of the components of the mechanical system;

to repeatedly determine at least one dynamic factor of one of the components of the mechanical system;

to calculate the movement factors of the remaining components of the mechanical system by means of a model of the mechanical system; and to determine individual mechanical parameters or a plurality of mechanical parameters, in particular separate mechanical parameters, of the components of the mechanical system from the determined movement factor, from the determined dynamic factor and from the calculated movement factors.

The statements made on the method in accordance with the invention apply accordingly to the industrial machine in accordance with the invention. This in particular applies to advantages and preferred embodiments.

The invention will be described purely by way of example with reference to the drawings. There are shown.

Figure 1:
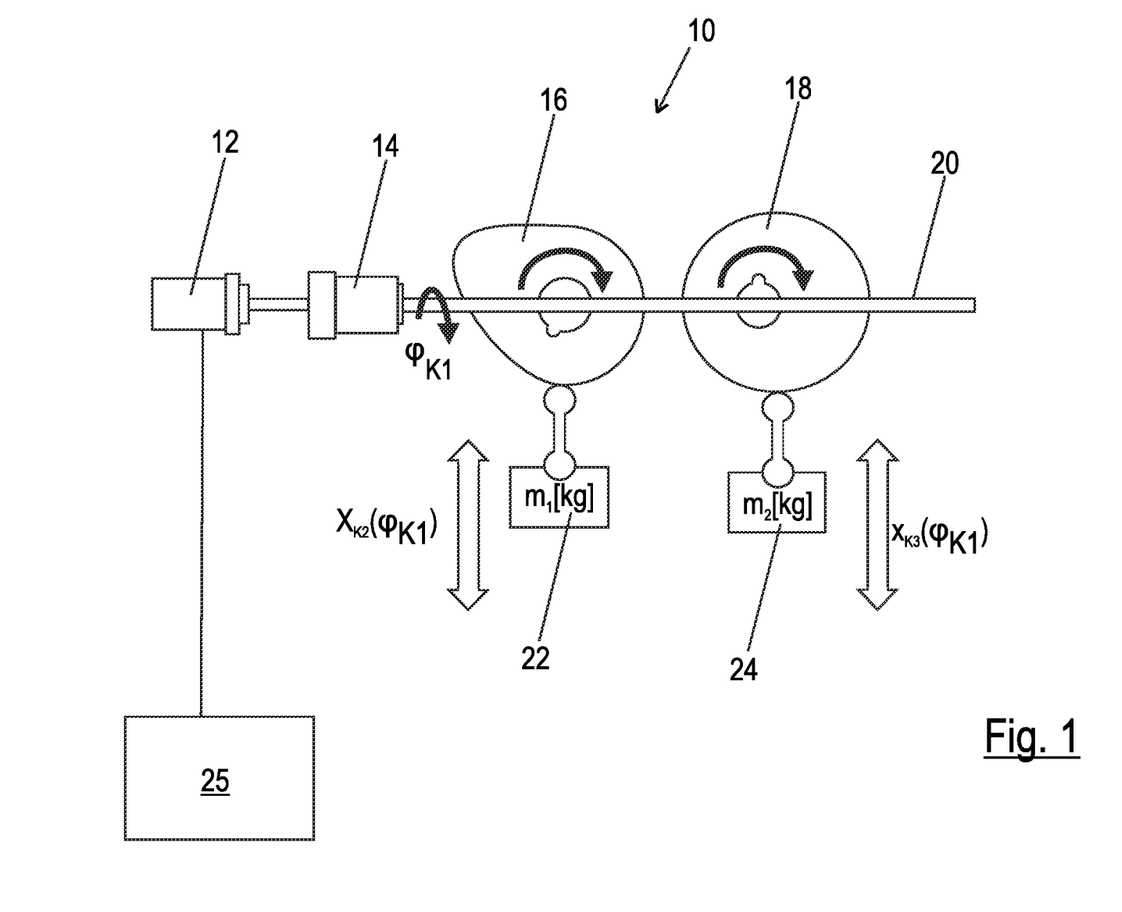
FIG. 1: the schematic design of a machine.

FIG. 1 shows a machine 10 which comprises a motor 12; a gear 14 coupled to the motor 12; a first cam disk 16; and a second cam disk 18. The gear 14 drives the cam disks 16, 18 in a rotational manner by means of a drive shaft 20.

The first cam disk 16 in turn moves a first weight 22 and the second cam disk 18 moves a second weight 24. Both weights 22, 24 are moved in a translational manner and against gravity.

The combination of the motor 12, the gear 14, the drive shaft 20 and the cam disks 16, 18 will be considered as the first component K1 of the machine 10 in the following. The first weight 22 is a second component K2 and the second weight 24 is a third component K3 of the machine 10.

The design of the machine 10 shown here is to be understood purely by way of example and only serves to illustrate the method of calculating the mechanical parameters. In general, mechanical parameters of machines of any desired design, in particular also of complex machines, can be determined with the specified approach.

The motor 12 is controlled by a control unit 25. The control unit 25 has the effect that the motor 12 delivers different rotational speeds and torques to the drive shaft 20 over time. The rotation of the drive shaft 20 which is variable in time is indicated by the function $\varphi_{K1}$ in FIG. 1.

The control unit 25 measures a current consumed by the motor 12 and from this calculates the torque delivered by the motor 12 to the drive shaft 20 in each case. In addition, the control unit 25 measures (e.g. via an encoder not shown) the respective instantaneous angular position of the motor shaft of the motor 12. The control unit 25 then calculates an angular speed and an angular acceleration of the motor 12 and/or of the drive shaft 20 from the change of the angular position over time.

A model of the mechanical system of the machine 10 is kept available in the control unit 25 or also in an external system not shown here. By means of the model, it is possible to draw a conclusion on the respective angular position of the cam disks 16, 18 from the respective angular position of the motor 12 on the basis of a known gear ratio. The position, the speed and the acceleration of the weights 22, 24 can then be calculated from the angular position of the cam disks 16, 18. The calculation takes place for the first weight 22 by means of a transfer function $x_{K2}(\varphi_{K1})$ and for the second weight 24 by means of a transfer function $x_{K3}(\varphi_{K1})$. The input quantity/factor for the transfer functions $x_{K2}$, $x_{K3}$ is the rotation of the drive shaft 20, i.e. the function ($\varphi_{K1}$, in each case.

Figure 2:
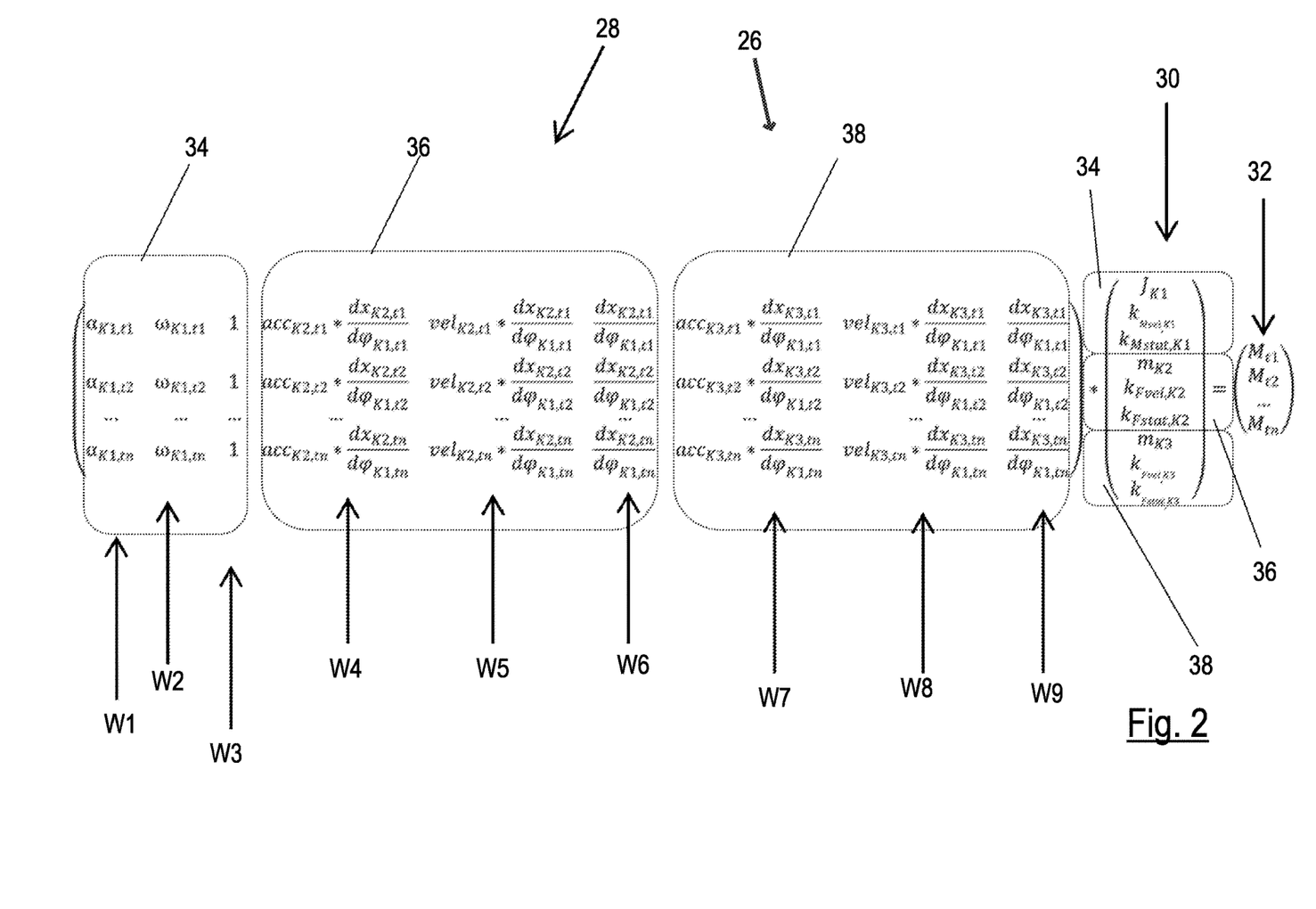
FIG. 2: a matrix equation system for determining mechanical parameters of the machine.

FIG. 2 shows a matrix equation system 26. The matrix equation system 26 comprises a matrix 28 which is multiplied by a first vector 30. This multiplication results in a second vector 32.

In a respective row of the matrix 28, respective measured values or values determined therefrom are entered for the same point in time. The first three values (W1, W2, W3) of each row relate to the first component K1 in this respect.

The values 4-6 (W4, W5, W6) of each row relate to the movement of the first weight 22 (i.e. of the second component K2), whereas the values 7-9 (W7, W8, W9) relate to the movement of the second weight 24 and thus to the third component K3.

The values belonging to the first component K1 are marked as the first region 34 in the matrix 28. Accordingly, the values belonging to the first weight 22 are marked as the second region 36 and the values belonging to the second weight 24 are marked as the third region 38.

The first value W1 of each row defines the angular acceleration $\alpha$ for the rotation of the drive shaft 20. The second value W2 is the angular speed $\omega$ for the rotation of the drive shaft 20. The third value W3 is constant 1.

The fourth and seventh values W4, W7 each indicate an acceleration acc of one of the weights 22, 24 which is multiplied by a derivative of the transfer function $$\left(\text{e.g. } \frac{dx_{K2,t1}}{d\varphi_{K1,t1}}\right).$$

The fifth and eighth values W5, W8 each indicate a speed vel of the first weight 22 or of the second weight 24 which is likewise multiplied by a derivative of the transfer function. Finally, the sixth and ninth values W6, W9 of each row only indicate the derivative of the transfer function for the first weight 22 and the second weight 24 respectively.

The mechanical parameters to be determined, i.e. the unknowns of the matrix equation system 26, are included in the vector 30. The first variable of the vector 30 represents a moment of inertia $J_{K1}$ of the first component. The second variable of the vector 30 is a parameter $k_{Mvel,K1}$ which indicates a torque dependent on the rotational speed. The third variable indicates a static torque $k_{Mstat,K1}$ (for example due to friction). The first three variables thus describe the first component K1.

The fourth to sixth variables of the first vector 30 describe the first weight 22 or its movement behavior. The fourth variable represents the mass $m_{K2}$ of the first weight 22, the fifth variable describes a speed-dependent force $k_{Fvel,K2}$ and the sixth variable describes a static force $k_{Fstat,K2}$ which is generated by the first weight 22.

In a corresponding manner, the seventh variable describes the mass $m_{K3}$ of the second weight 24, the eighth variable describes a speed-dependent force $k_{Fvel,K3}$ and the ninth variable describes a constant force $k_{Fconst,K3}$. Accordingly, the variables 1-3 are associated with the first region 34, the variables 4-6 are associated with the second region 36 and the variables 7-9 are associated with the third region 38.

In the second vector 32, the torques $M_{t1}$ to $M_{tn}$ that are introduced by the motor 12 and measured at a point in time (t1, t2, . . . , tn) represented in a respective row are indicated for this point in time.

An equation with nine unknowns (the nine variables of the first vector 30) results for each row of the matrix 28 when the matrix equation system 26 is solved. The remaining values were either measured or calculated using the model of the mechanical system, as stated above.

The matrix equation system 26 can be unambiguously solved by the multiplication of both sides of the matrix equation system 26 by the transpose of the matrix 28.

For example, more than 1000 or more than 10,000 measurements are in particular carried out at a large number of points in time, e.g. within one machine cycle or within a plurality of machine cycles. A row is generated in the matrix equation system 26 for each measurement, wherein the values measured or calculated at the respective point in time are entered in the row. Accordingly, the matrix 28 and thus also the second vector 32 can comprise more than 1000 or more than 10,000 rows.

In this way, a statement can be made on the mechanical parameters of all the components of the machine 10 solely by the measurement of the torque generated by the motor 12 and by the measurement of the position of the motor 12. The motor 12 together with the control unit 25 thus serves as the only measurement device. The movement factors summarized in the matrix 28 can be determined at any point in time by the measurements of the motor 12, whereby the mechanical parameters 30 can then in turn be determined. The behavior of the mechanical system of the machine can be predicted by the mechanical parameters, whereby a feedforward control of the motor 12 can take place. The running properties of the machine 10 can hereby be considerably improved. In addition, smaller/lighter motors 12 can e.g. be used than is customary so that costs for the motor 12 and also the energy consumption for the operation of the machine 10 can be considerably reduced.

In addition, there is the advantage that the mechanical parameters 30 are each associated with a defined component so that e.g. the component at which an increased friction currently occurs can also e.g. be recognized in complex drive trains, among other things, in ongoing operation solely by the measurement at the motor 12. This component can then e.g. be maintained in a targeted manner, whereby the work of maintenance personnel is simplified. It is thus possible, in particular in the operating phase of a machine 10, to compare the desired behavior of the machine 10 in accordance with the machine design with the real/current behavior at any time to recognize deviations and to introduce targeted counter-measures, e.g. in real time, by a feedfoward control of the drive torque of the motor 12.

REFERENCE NUMERAL LIST 10 machine
12 motor
14 gear
16 first cam disk
18 second cam disk
20 drive shaft
22 first weight
24 second weight
25 control unit
26 matrix equation system
28 matrix
30 first vector
32 second vector
34 first region
36 second region
38 third region
$\varphi_{K1}$ function of the rotation of the drive shaft
$x_{K2}(\varphi_{K1})$ first transfer function
$x_{K3}(\varphi_{K1})$ second transfer function
K1 first component
K2 second component
K3 third component
W1-W9 first to ninth value

The invention claimed is:

1. A method of monitoring a machine in which a mechanical system is moved by a motor, wherein the mechanical system comprises more than two components coupled to one another, wherein one of the components comprises the motor, wherein at least two of the components move differently when the motor drives the mechanical system, and wherein
at least one movement factor of one of the components of the mechanical system is determined repeatedly;
at least one dynamic factor of one of the components of the mechanical system is determined repeatedly;
the movement factors of the remaining components of the mechanical system are calculated by means of a model of the mechanical system; and
separate mechanical parameters for the components of the mechanical system are determined from the determined movement factor, from the determined dynamic factor and from the calculated movement factors.

2. The method in accordance with claim 1,
wherein a plurality of values of the determined movement factor and/or of the determined dynamic factor are used to determine the mechanical parameters for the components of the mechanical system.

3. The method in accordance with claim 1,
wherein an equation system having a plurality of equations is set up and solved to determine the mechanical parameters.

4. The method in accordance with claim 3,
wherein the equation system is having one equation per value of the determined movement factor.

5. The method in accordance with claim 1,
wherein the movement factor comprises a speed; a position; an acceleration; an angular speed; an angular position; and/or an angular acceleration.

6. The method in accordance with claim 1,
wherein the model of the mechanical system comprises at least one transfer function $(x_1, x_2)$ which describes the movement of a first component in dependence on the movement of a second component which is coupled to the first component.

7. The method in accordance with claim 6,
wherein the movement factors are each multiplied by a derivative of the transfer function which describes the movement of the respective component.

8. The method in accordance with claim 1,
wherein the mechanical parameters comprise a torque; and/or a force;
and/or a parameter for calculating a torque or a force.

9. The method in accordance with claim 8,
wherein the parameter for calculating the torque or the force is based on an acceleration or a speed.

10. The method in accordance with claim 1,
wherein the method is carried out separately several times, in particular twice, to determine mechanical parameters for different directions of movement of a component.

11. The method in accordance with claim 10,
wherein the method is carried out separately twice, to determine mechanical parameters for different directions of movement of a component.

12. The method in accordance with claim 1,
wherein the determined movement factor and/or the determined dynamic factor is/are measured and/or calculated from a measured value.

13. The method in accordance with claim 12,
wherein the determined movement factor and/or the determined dynamic factor is/are measured and/or calculated from a motor torque.

14. The method in accordance with claim 1,
wherein a new determination of the mechanical parameters takes place when the determined movement factor and/or the determined dynamic factor changes/change, for example by more than 10% or by more than 15%.

15. The method in accordance with claim 1,
wherein the model of the mechanical system comprises a digital twin.

16. The method in accordance with claim 1,
wherein a value for at least one mechanical parameter is determined several times and a final value for the mechanical parameter is calculated from the plurality of values.

17. The method in accordance with claim 1,
wherein a change of the control of the motor takes place on the basis of at least one of the mechanical parameters.

18. The method in accordance with claim 1,
wherein a predictive maintenance of the machine is carried out on the basis of at least one mechanical parameter.

19. An industrial machine having a mechanical system which comprises a motor and at least two further components, wherein the components are coupled to one another, wherein at least the two components move differently when the motor drives the mechanical system, and wherein the machine comprises at least one sensor and a processing device and is designed
to repeatedly determine at least one movement factor of one of the components of the mechanical system;
to repeatedly determine at least one dynamic factor of one of the components of the mechanical system;
to calculate the movement factors of the remaining components of the mechanical system by means of a model of the mechanical system; and to determine separate mechanical parameters for the components of the mechanical system from the determined movement factor, from the determined dynamic factor and from the calculated movement factors.

* * * * *